United States Patent
Grewing et al.

(10) Patent No.: US 6,621,364 B2
(45) Date of Patent: Sep. 16, 2003

(54) VOLTAGE-CONTROLLED OSCILLATOR FOR FREQUENCY MODULATION

(75) Inventors: Christian Grewing, Düsseldorf (DE); Klaus Getta, Bochum (DE); Udo Matter, Düsseldorf (DE); Faramarz Rassouli, San Diego, CA (US)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/040,213

(22) Filed: Jan. 3, 2002

(65) Prior Publication Data

US 2002/0089387 A1 Jul. 11, 2002

(30) Foreign Application Priority Data

Jan. 3, 2001 (DE) .......................................... 101 00 113

(51) Int. Cl.$^7$ ................................................. H03B 1/00
(52) U.S. Cl. ............................. 331/177 V; 331/117 R; 331/36 C
(58) Field of Search ..................... 331/117 R, 117 FE, 331/117 D, 36 C, 177 V

(56) References Cited

U.S. PATENT DOCUMENTS 4,904,964 A * 2/1990 Peng et al. ................. 332/123
6,218,909 B1 * 4/2001 Eban ....................... 331/117 R
6,466,099 B2 * 10/2002 Festag ..................... 331/117 R

FOREIGN PATENT DOCUMENTS

| DE | 34 47 118 A1 | 7/1986 |
| DE | 38 27 429 A1 | 9/1989 |
| DE | 42 41 241 A1 | 8/1994 |

* cited by examiner

*Primary Examiner*—Henry Choe
(74) *Attorney, Agent, or Firm*—Laurence A. Greenberg; Werner H. Stemer; Gregory L. Mayback

(57) ABSTRACT

A voltage-controlled oscillator for frequency modulation includes an oscillator core with a tunable resonant circuit component which is driven with a control voltage. Furthermore, a modulator component is provided which is driven with a modulation signal for frequency modulation. The modulator component is additionally coupled to the terminal for supplying the control voltage. As a result, a constant modulation deviation can be achieved over the entire tuning range even in the case of oscillators having a large tuning range. The oscillator circuit is particularly suitable for use in transmitting circuits for digital communication.

8 Claims, 1 Drawing Sheet

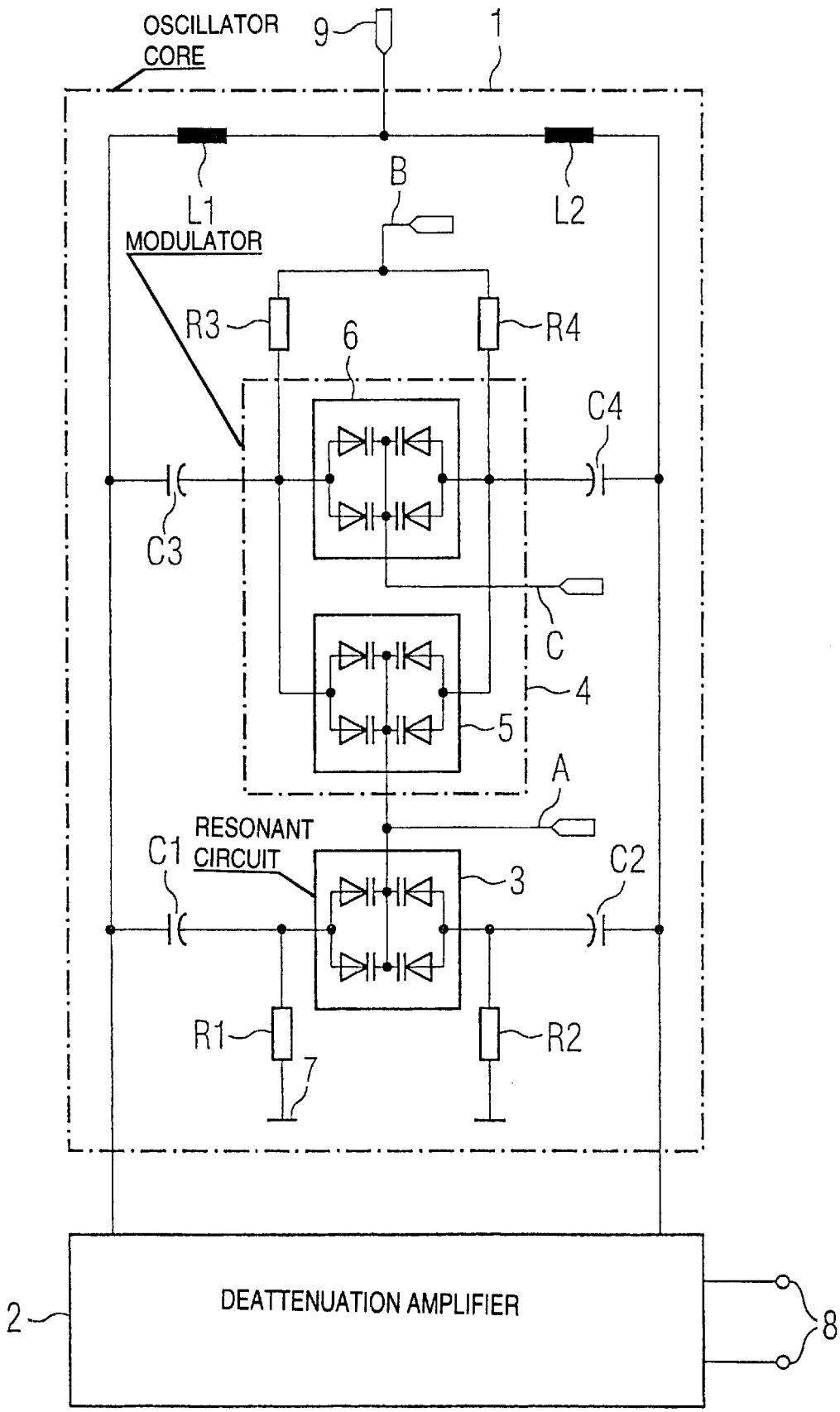

VOLTAGE-CONTROLLED OSCILLATOR FOR FREQUENCY MODULATION

BACKGROUND OF THE INVENTION

Field of the Invention

The invention relates to a voltage-controlled oscillator (VCO) for frequency modulation (FM).

Frequency modulation is one of the known modulation methods used in digital transmission systems. Such digital transmission systems are, for example, DECT (Digital Enhanced Cordless Telecommunication), which is used in cordless telephones, or BLUETOOTH, which has been configured as a standard for an interface for wireless communication over short distances.

In the frequency modulation method, the digitally coded information to be transmitted is modulated onto a carrier, for example a high-frequency sinusoidal oscillation. The standards described specify limit values for the modulation deviation. The modulation deviation or modulation excursion is here one half of the difference between the frequency with which a digital zero is coded and the frequency with which a digital one is coded if the information to be transmitted is binary coded. The modulation deviation must not exceed or drop below its limit values.

Highly integrated voltage-controlled oscillators which can be used in phase-locked loops, as needed in transmitters for such mobile radio systems, usually have tolerances since the frequency-determining integrated components are subject to manufacturing tolerances. VCOs, for example, can be constructed as LC oscillators in which the frequency of oscillation at a certain tuning voltage is influenced by tolerances of the components, especially inductance and capacitance. To achieve, in normal operation, a tuning range which is, for example, 100 MHz, it is usual to make the tuning range of a VCO greater when configuring its circuit, for example 600 MHz if the absolute frequency range is approx. 2.5 GHz. The tuning range is the range of an output signal of the VCO which is between a minimum tunable frequency and a maximum tunable frequency.

Such large tuning ranges, however, require that the capacitance in the resonant circuit, for example of LC oscillators having a fixed inductance, must be variable within a wide tuning range. However, this creates the problem that, for example if an adjustable modulation capacitance is used, it is not possible to achieve a constant modulation deviation over the entire tunable frequency range but, instead, the modulation deviation changes greatly over the tunable range and, in doing so, violates limit values of the specifications.

To illustrate the problems with a numerical example: a VCO with LC resonator has an inductance with a fixed inductance value of 2 nH. To achieve a tuning range of 2.2–2.8 GHz, the capacitance effective in the resonator must be adjustable from 1.62–2.62 pF. At the lower limit of the tuning range at 2.2 GHz, a modulation capacitance of 0.38 fF (femto-farad) is required for a modulation deviation of 160 KHz as required by BLUETOOTH. At the upper tuning limit of 2.8 GHz, however, the same modulation capacitance produces a modulation deviation of 328 KHz which is above the specified limit value.

It is already known to achieve a calibration of the fixed inductance value of the VCO in voltage-controlled oscillators by reducing a coil having too large an inductance value in a suitable manner in a calibration step during production. However, such calibration is both costly and time-consuming. Such calibration can be performed, for example, by using a laser. After the calibration of the inductance, the modulation deviation must be measured for each channel in which the VCO is to be operated. These measurement values can be stored in a baseband IC (integrated circuit) and conveyed to the radio frequency IC, for example via a databus, before each channel change in a transmit mode. This requires additional memory and furthermore the additional transmission of information before each channel change. In addition, a single measurement of the modulation deviation in the different channels is required. It is, therefore, desirable to be able to use a VCO without calibration and with constant modulation deviation, which requires only one single measurement of the modulation deviation.

Published, Non-Prosecuted German Patent Application No. DE 42 41 241 A1 discloses a voltage-controlled oscillator configured for frequency modulation. To achieve a constant frequency deviation, a coupling inductance is provided which couples the tuning input to a modulation capacitance. Such inductances, however, disadvantageously have a large space requirement.

SUMMARY OF THE INVENTION

It is accordingly an object of the invention to provide a voltage-controlled oscillator which overcomes the above-mentioned disadvantages of the heretofore-known configurations of this general type and which maintains a required modulation deviation over a large tuning range without elaborate calibration.

With the foregoing and other objects in view there is provided, in accordance with the invention, a voltage-controlled oscillator for frequency modulation, including:

an oscillator core including a tunable, frequency-determining resonant circuit component and a frequency-determining modulator component;

a first terminal for supplying a control voltage, the first terminal being coupled to the frequency-determining modulator component and being connected to the tunable, frequency-determining resonant circuit component for providing a frequency tuning;

a second terminal for supplying a modulation signal connected to the frequency-determining modulator component;

a third terminal for supplying a bias voltage;

an output terminal coupled to the oscillator core, the output terminal providing an output signal, the output signal being frequency modulated in dependence on the modulation signal and having a carrier frequency tuned in dependence on the control voltage; and the frequency-determining modulator component including a first voltage-controlled capacitance and a second voltage-controlled capacitance connected in parallel to the first voltage-controlled capacitance, the first voltage-controlled capacitance being connected to the first terminal for supplying the control voltage and being controlled by the control voltage, the second voltage-controlled capacitance being connected the third terminal for supplying the bias voltage.

In other words, the object of the invention is achieved through the use of a voltage-controlled oscillator for frequency modulation which has an oscillator core having at least one tunable frequency-determining resonant circuit component which is connected to a terminal for supplying a control voltage, a frequency-determining modulator component which is connected to a terminal for supplying a modulation signal, the modulator component being coupled to the terminal for supplying the control voltage, and with an output terminal coupled to the oscillator core for picking up an output signal which is frequency modulated in dependence on the modulation signal and which has a carrier frequency tuned in dependence on the control voltage, the modulator component including a first voltage-controlled capacitance which, in order to be controlled, is connected to the terminal for supplying the control voltage, and the modulator component including a second voltage controlled capacitance which is connected in parallel with the first voltage-controlled capacitance and is coupled to a terminal for supplying a bias voltage.

The coupling of the modulator component to the terminal for supplying the control voltage can be constructed in a simple manner in such a way that the dependence of the modulation deviation on the frequency of the VCO set through the use of the resonant circuit component is compensated for.

Modulator component and resonator component can be jointly integrated in a resonator of the oscillator.

The oscillator core can have a resonator which can be constructed, for example, as LC oscillator or as RC oscillator.

The frequency-determining resonant circuit component can be, for example, the inductance or the capacitance of the resonator in the case of LC oscillators and the resistance or the capacitance of the oscillator in the case of RC oscillators.

In the case of LC oscillators, for example, the capacitance can be constructed as a varactor, usually as a capacitance diode with a junction capacitance which depends on the voltage applied.

Whereas a very great deviation of the oscillator frequency in dependence on deviations of an applied control voltage can be achieved through the use of the resonant circuit component, only relatively small frequency deviations, which are usually smaller by orders of magnitude than those caused by the resonant circuit component, are achieved through the use of the modulator component. Accordingly, the resonant circuit component can be tuned within a wide range whereas the modulator component can be tuned within a very small range. For example, frequency tuning from 2.2 to 2.8 GHz can be achieved through the use of the resonant circuit component whereas the modulation deviation which can be achieved through the use of the frequency-determining modulator component can be, for example, around 160 KHz. Coupling the terminal for supplying the control voltage to the modulator component makes it possible to keep the modulation deviation constant over the wide frequency range of the VCO. Accordingly, the modulation deviation is independent of the oscillating frequency of the resonator set.

The principle described can be implemented in digital or in analog circuit technology.

The modulator component can be connected directly to the terminal for supplying the control voltage.

According to the present invention, the modulator component includes a first voltage-controlled capacitance which, to be controlled, is connected to the terminal for supplying the control voltage. The voltage-controlled capacitance can be, for example, a varactor, particularly a capacitance diode with a junction capacitance which is constructed to be controllable.

Furthermore, the modulator component includes a second voltage-controlled capacitance which is connected in parallel with the first voltage-controlled capacitance and is coupled to a terminal for supplying a bias voltage.

Biasing, for example, a capacitance diode in the reverse direction prevents it from breaking down.

In a preferred embodiment of the present invention, a deattenuation amplifier or compensation amplifier is provided which is coupled to the oscillator core and exhibits the terminal at which the output signal of the oscillator is provided. Apart from the oscillator core already described, a voltage-controlled oscillator usually has a deattenuation or compensation amplifier which is constructed as active circuit component and provides a negative impedance for compensating for losses in the resonator. At the output of the deattenuation amplifier, an output signal can be picked up which has an oscillation or carrier frequency which is adjustable through the use of the control voltage. The deattenuation amplifier can include, for example, two cross-coupled transistors. The cross coupling can be, for example, capacitive.

Such an oscillator can be used, for example, in a phase-locked loop (PLL).

In another preferred embodiment of the present invention, the modulator component is connected to the terminal for supplying the modulation signal via at least one coupling resistor. Instead of the coupling resistor, other components for DC coupling can also be used.

In a further preferred embodiment of the invention, the resonant circuit component includes a third voltage-controlled capacitance which is connected via at least one further coupling resistor to a reference potential terminal and which, to be controlled, is connected to the terminal for supplying the control voltage.

In a further, advantageous embodiment of the present invention, the capacitance value of the third voltage-controlled capacitance or of the resonant circuit component, respectively, is greater by a factor of 10 or more than the capacitance value of the modulator component. The capacitance value of the modulator component can be composed of a number of varactors connected in parallel.

In a further advantageous embodiment of the present invention, first coupling capacitances are provided for coupling the resonant circuit component to at least one inductance and second coupling capacitances are provided for coupling the modulator component to the at least one inductance. In addition to the coupling described, the coupling capacitances can couple at the same time the oscillator core to the deattenuation amplifier and to a supply potential terminal.

In a further preferred embodiment of the invention, the capacitance value of the second coupling capacitance is smaller by a factor of 10 or more than that of the first coupling capacitances.

The fact that the resonant circuit component and its coupling capacitances have a capacitance value which is large compared with the capacitance value of the modulator component and its coupling capacitances has the result that a relatively large frequency deviation can be achieved through the use of the control voltage whereas only a relatively small frequency deviation corresponding to the modulation deviation can be achieved with the modulation signal.

In a further preferred embodiment of the present invention, the oscillator exhibits a balanced, i.e. symmetric, circuit configuration. The balanced circuit configuration, in particular, provides for high interference immunity.

Other features which are considered as characteristic for the invention are set forth in the appended claims.

Although the invention is illustrated and described herein as embodied in a voltage-controlled oscillator for frequency modulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a simplified circuit diagram of an exemplary embodiment of an oscillator according to the invention.

DESCRIPTION OF THE PREFERRED EMBODIMENTS

Referring now to the single FIGURE of the drawing in detail, there is shown a voltage-controlled oscillator with an oscillator core 1 and a deattenuation amplifier 2 connected thereto, the deattenuation amplifier 2 being shown only schematically.

The oscillator core 1 exhibits a balanced, i.e. symmetric, circuit configuration. At the deattenuation amplifier 2, an output terminal 8 is provided at which an output signal is available the frequency of which can be tuned through the use of a control voltage A. Furthermore, the oscillator core can be supplied with a modulation signal B which can supply the oscillator with the digitally coded information to be transmitted via a transmission channel.

The oscillator core 1 is constructed as an LC oscillator. In this configuration, fixed inductances L1, L2 are provided which are in each case connected with one terminal to a supply voltage terminal 9. The inductances L1, L2 are connected with their free terminals to coupling capacitances C1, C2, C3, C4 and to the deattenuation amplifier 2.

The resonant circuit component 3, which can be supplied at one input with the control voltage A determining the resonant circuit frequency, is connected to one each of the two coupling capacitances C1, C2 and to one resistor R1, R2 each, the latter being connected to a reference potential terminal 7. The resonant circuit component 3 includes a number of capacitance diodes, the cathodes of which are connected to one another and to the terminal for supplying the control voltage A and the anodes of which are connected to the coupling capacitances C1, C2 and the coupling resistors R1, R2.

The modulator component 4 includes two voltage-controlled capacitances 5, 6 which are connected in parallel and which are in each case formed of capacitance diodes, the cathodes of which are connected to one another. The first voltage-controlled capacitance 5 can be supplied with the control voltage A at an input controlling the capacitance value whilst the second voltage-controlled capacitance 6 can be supplied with a bias voltage C at an input controlling the capacitance value. The first voltage-controlled capacitance 5 includes capacitance diodes, the cathodes of which are connected to one another and to the terminal for supplying the control voltage A and the anodes of which are connected to one coupling capacitance C3, C4 each.

In consequence, the control inputs of the first voltage-controlled capacitance 5 and the resonant circuit component 3 are directly connected to one another.

The second voltage-controlled capacitance 6 includes capacitance diodes, the cathodes of which are connected to one another and to the terminal for supplying the bias voltage C and the anodes of which are connected to the coupling capacitances C3, C4. Accordingly, the first and second voltage-controlled capacitances are connected in parallel. The balanced circuit node formed at the anodes of the capacitance diodes in this parallel circuit is connected, in addition to the coupling capacitances C3, C4 to coupling resistors R3, R4, the free ends of which are connected to the terminal for supplying the modulation signal B.

The capacitance values of the first coupling capacitances C1, C2 are large compared with the capacitance values of the second coupling capacitances C3, C4. Furthermore, the capacitance values of varactor diodes, which are comprised of a third voltage-controlled capacitance in the resonant circuit component 3, are large compared with the capacitance values which result from the parallel connection of the first and second voltage-controlled capacitances 5, 6. The capacitance values differ from one another at least by a factor of 10 in each case.

The resonator in the oscillator core 1 can be tuned within a frequency range from 2.2 to 2.8 GHz through the use of the control voltage A. The modulation deviation which can be achieved through the use of the modulation signal B is 160 KHz.

According to the proposed principle, however, the modulator component 4 can also be supplied with the control voltage A for compensation purposes in such a manner that the modulation deviation of 160 KHz remains constant over the entire tunable frequency range of the oscillator. If, for example, the control voltage A rises, for example from 1 to 2 volts, the capacitance of the resonant circuit component 3 increases. This is because the anode of the varactor 3 is DC coupled to the reference potential terminal 7 via the resistors R1, R2. At the same time, the first voltage-controlled capacitance 5, particularly its capacitance diodes, are blocked more. This ensures that a relatively smaller capacitance change is effected in the modulator component 4 through the use of the modulation signal B. In the present exemplary embodiment, the controlling voltage of the modulation signal B does not have a DC component and moves within a range of 0 to 20 mV. The bias voltage C is +1 V. This ensures that the capacitance diodes are operated in a reverse direction.

The principle described, namely to use the tuning voltage A, which voltage is known in any case, for achieving always a constant modulation deviation over a large tunable frequency range of a VCO, can also be implemented in a digital circuit instead of the analog circuit implementation shown. In this configuration, for example, the control voltage A could be measured and digitized and used for reprogramming the modulation signal B so that the modulation deviation is always constant over the entire tunable frequency range of the oscillator.

Using the principle described, voltage-controlled oscillators for frequency modulation can have a constant modulation deviation over a large frequency range especially if the frequency-determining component of the oscillator has a tolerance.

Using the circuit described, the modulation signal B produces a smaller capacitance change of the effective capacitance in the resonator at large control voltages A.

Accordingly, the modulation capacitance, that is to say the capacitance of the modulator component 4, is variable and depends on the respective applicable control voltage A. This is achieved not by placing some of the capacitances in the modulator component 4 at a fixed potential but by biasing the voltage-controlled capacitance 5 with a control voltage A.

We claim:

1. A voltage-controlled oscillator for frequency modulation, comprising:

an oscillator core including a tunable, frequency-determining resonant circuit component and a frequency-determining modulator component;

a first terminal for supplying a control voltage, said first terminal being coupled to said frequency-determining modulator component and being connected to said tunable, frequency-determining resonant circuit component for providing a frequency tuning;

a second terminal for supplying a modulation signal connected to said frequency-determining modulator component;

a third terminal for supplying a bias voltage;

an output terminal coupled to said oscillator core, said output terminal providing an output signal, the output signal being frequency modulated in dependence on the modulation signal and having a carrier frequency tuned in dependence on the control voltage; and said frequency-determining modulator component including a first voltage-controlled capacitance and a second voltage-controlled capacitance connected in parallel to said first voltage-controlled capacitance, said first voltage-controlled capacitance being connected to said first terminal for supplying the control voltage and being controlled by the control voltage, said second voltage-controlled capacitance being connected said third terminal for supplying the bias voltage.

2. The voltage-controlled oscillator according to claim 1, including a deattenuation amplifier coupled to said oscillator core, said deattenuation amplifier including said output terminal providing the output signal.

3. The voltage-controlled oscillator according to claim 1, including at least one coupling resistor, said frequency-determining modulator component being connected to said second terminal for supplying the modulation signal via said at least one coupling resistor.

4. The voltage-controlled oscillator according to claim 1, including:

a fourth terminal for providing a reference potential;

at least one coupling resistor;

said tunable, frequency-determining resonant circuit component including a third voltage-controlled capacitance; and said third voltage-controlled capacitance being connected, via said at least one coupling resistor, to said fourth terminal for providing the reference potential, and said third voltage-controlled capacitance being connected to said first terminal for supplying the control voltage in order to be controlled by the control voltage.

5. The voltage-controlled oscillator according to claim 4, wherein:

said third voltage-controlled capacitance has a first capacitance value; and said frequency-determining modulator component has a second capacitance value, the first capacitance value is greater than the second capacitance value by a factor of at least 10.

6. The voltage-controlled oscillator according to claim 1, including:

at least one inductance;

first coupling capacitances coupling said tunable, frequency-determining resonant circuit component to said at least one inductance; and second coupling capacitances coupling said frequency-determining modulator component to said at least one inductance.

7. The voltage-controlled oscillator according to claim 6, wherein said first coupling capacitances have a first capacitance value, said second coupling capacitances have a second capacitance value, and the second capacitance value is smaller than the first capacitance value by a factor of at least 10.

8. The voltage-controlled oscillator according to claim 1, wherein said oscillator core is configured as a symmetric circuit configuration.

* * * * *